United States Patent [19]

Bobeck

[11] 4,142,249

[45] Feb. 27, 1979

[54] CONDUCTOR-ACCESS, MAGNETIC BUBBLE MEMORY

[75] Inventor: Andrew H. Bobeck, Chatham, N.J.

[73] Assignee: Bell Telephone Laboratories, Incorporated, Murray Hill, N.J.

[21] Appl. No.: 857,920

[22] Filed: Dec. 6, 1977

[51] Int. Cl.² .............................................. G11C 19/08
[52] U.S. Cl. ........................................ 365/19; 365/33; 365/44
[58] Field of Search .................... 365/8, 19, 36, 37, 44

[56] References Cited

U.S. PATENT DOCUMENTS 3,967,002  6/1976  Almasi et al. ........................... 365/37

OTHER PUBLICATIONS

AIP Conference Proceedings on Magnetism and Magnetic Materials–No. 24, Dec. 3–6, 1974, pp. 550–551.

Primary Examiner—James W. Moffitt
Attorney, Agent, or Firm—Herbert M. Shapiro

[57] ABSTRACT

A low power, conductor-access, bubble memory is realized with a single level of metallization for providing the requisite propagation fields. Sets of apertures in the conducting layer define bubble paths, and permalloy elements aligned with the apertures overlie the conducting layer at end portions and contact the exposed bubble layer at midportions. Current flow is established transverse to the bubble paths.

9 Claims, 4 Drawing Figures

CONDUCTOR-ACCESS, MAGNETIC BUBBLE MEMORY

CROSS REFERENCE TO RELATED APPLICATIONS

The present application is related to patent applications, Ser. Nos. 857,919, 857,921, and 857,925, filed Dec. 6, 1977 for A. H. Bobeck.

FIELD OF THE INVENTION

This invention relates to magnetic bubble memories and more specifically to such memories utilizing current pulses applied to a pattern of electrically conducting material for moving bubbles in an adjacent bubble layer.

BACKGROUND OF THE INVENTION

A magnetic bubble is a magnetic domain characterized by a single domain wall which closes upon itself in the plane of a layer of magnetic material in which it can be moved. Inasmuch as the wall thereabout closes on itself a bubble domain is self-defined and is capable of being moved anywhere in the plane. Magnetic memories employing domains of this type are disclosed in A. H. Bobeck, U.S. Pat. No. 3,460,116, issued Aug. 5, 1969.

Two well-known techniques for moving magnetic bubbles in such memories are commonly referred to as "conductor" and "field-access" drive arrangements. The conductor-access type of bubble memory is disclosed in the above-mentioned Patent of A. H. Bobeck. The field-access type of bubble memory is disclosed in U.S. Pat. No. 3,534,347 of A. H. Bobeck, issued Oct. 13, 1970.

The conductor-access type memory comprises a layer of magnetic material in which magnetic bubbles can be moved. The bubble layer commonly comprises an epitaxially grown garnet material on a nonmagnetic garnet substrate. Several patterns of electrical conductors are formed adjacent the epitaxial layer with the appropriate insulating layers between them. The above-mentioned patent of A. H. Bobeck relating to conductor-access memories discloses an implementation comprising three patterns of undulating electrical conductors in several layers of metallization. The conductors are situated in positions offset from one another along a path of bubble propagation and are pulsed in a three-phase manner to insure directionality of bubble movement as is well understood in the art. The conductor-access arrangement employs intricate electrical conductors which cross one another and are therefore subject to shorts, as well as to defects, which render manufacturing yields of such memory devices low. Moreover, high power requirements characterize all prior art current-access drive arrangements.

R. F. Fischer, U.W. Pat. No. 3,564,518, issued Feb. 16, 1971, discloses a method for the propagation of bubbles which utilizes a "two-phase" conductor-access arrangement employing offset permalloy elements for determining the direction of bubble movement. The permalloy elements are disposed to provide low energy or rest positions for bubbles in positions offset from those to which the bubbles are moved by a pulse applied to one of the conductors.

U.S. Pat. Nos. 3,693,177 and 3,678,479, issued Sept. 19, 1972 and July 18, 1972, respectively, disclose a "single level" conductor-access arrangement for bubbles. The arrangements comprise, in effect, a single undulating conductor which crisscrosses a succession of positions in a bubble path. A bipolar pulse applied to the conductor provides two phases of operation with the single conductor level. The bubble layer itself is of a geometry to provide for bubble offset to rest positions.

The field-access type memory, in contradistinction, utilizes a pattern of permalloy elements which defines a plurality of bubble propagation paths. These elements are arranged in a plane closely spaced apart from the epitaxial layer and are responsive to a uniform magnetic field reorienting in the plane of bubble movement to provide moving magnetic pole patterns which the bubbles follow as is well understood. Half-disc, T-bar, and chevron-shaped elements are all familiar geometries characteristic of field-access type memories.

Field-access arrangements require relatively costly field coils to generate the reorienting in-plane field and also require that that field be provided over a relatively large area necessitating exacting tolerances for the field coils. Moreover, high speeds of operation are difficult to achieve in field-access arrangements because the requisite increasingly larger fields are increasingly difficult to switch.

The conductor-access arrangement on the other hand is difficult to realize because large and uniform electrical conductor patterns are hard to achieve in practice and are characterized by high power dissipation and nonuniformities in current flow. Moreover, even single level conductor geometries when extended to multiple channel operation cause bubble strip out across channels necessitating the separation of the underlying bubble layer into strips as disclosed in the above-noted U.S. Pat. Nos. 3,693,177 and 3,678,479.

The problem thus is to achieve a conductor-access bubble memory with relatively uniform overall current flow, low power dissipation and a single level of metallization.

BRIEF DESCRIPTION OF THE INVENTION

The solution to the problem is based on the recognition that an array of low energy or rest positions for bubbles can be defined in a bubble layer and that pemalloy elements can be used in conjunction with a single electrically-conducting film in which sets of localized apertures are formed to define decoupled paths for bubble propagation. The permalloy elements are formed in a manner so that the distance between portions of each element and the bubble layer varies. It is considered that this use of an out-of-plane permalloy element for defining rest positions is particularly novel also.

In one embodiment, a permalloy rectangle is formed on top of each of a plurality of C-shaped apertures in the conducting layer so that the midsection of the element contacts the bubble layer while the ends thereof lie on the conducting layer. A bipolar current waveform is applied to the conducting layer resulting in an overall uniform current flow configured by the apertures into a succession of localized propagation fields. These fields are operative to move bubbles along propagation channels defined by the sets of apertures. Thus, a magnetic bubble memory in accordance with the invention is characterized by an electrically-conducting film overlying a layer of magnetic material in which bubbles can be moved where the film includes a plurality of sets of apertures defining a plurality of bubble paths and each aperture has associated with it a permalloy element which overlies the conducting film at the aperture and includes at least a portion of the element relatively close to the underlying bubble layer.

DETAILED DESCRIPTION

Figure 1:
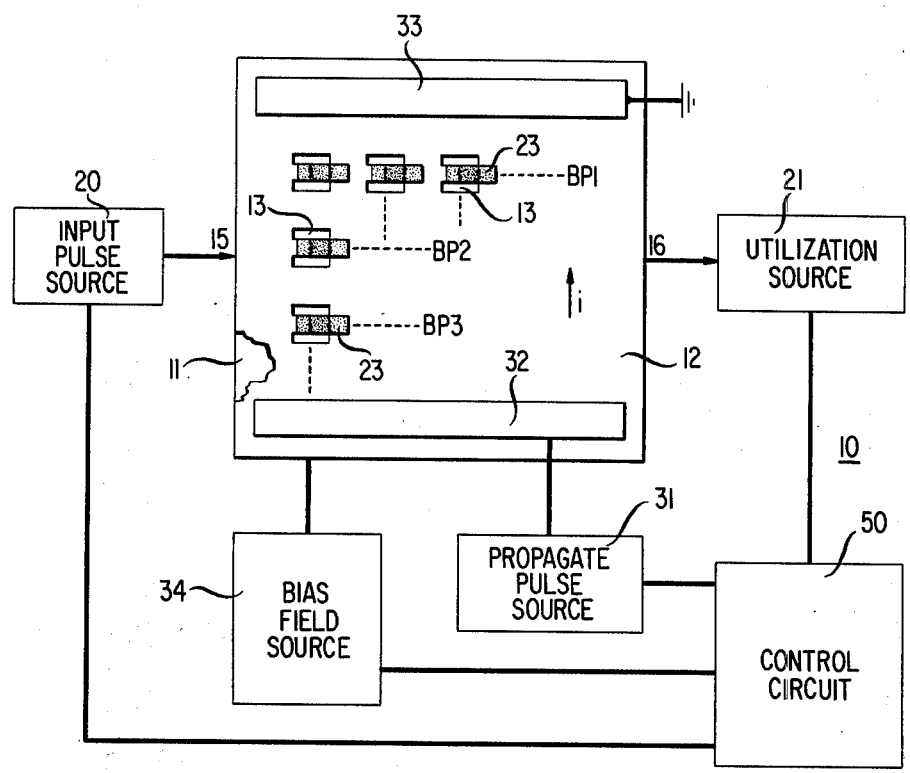
FIG. 1 shows a schematic representation of a magnetic bubble memory in accordance with this invention.

FIG. 1 shows a magnetic bubble memory 10. The memory includes a layer 11 of material in which magnetic bubbles can be moved. A film 12 of conducting material overlies layer 11 and includes therein an array of apertures 13. The apertures are aligned, illustratively, in rows and columns, each row comprising a set of apertures which defines a bubble path. The bubble paths are designated BP1, BP2, BP3 from top to bottom as viewed in FIG. 1 and extend from an input on the left to a detector area on the right. The input and output areas are designed 15 and 16, respectively, and may comprise any suitable bubble generator arrangement and detector. Copending application, Ser. No. 857,919, filed for A. H. Bobeck on even date herewith, discloses a detector arrangement suitable to this end. A suitable input pulse source and a utilization circuit are represented by blocks 20 and 21, respectively.

Figure 2:
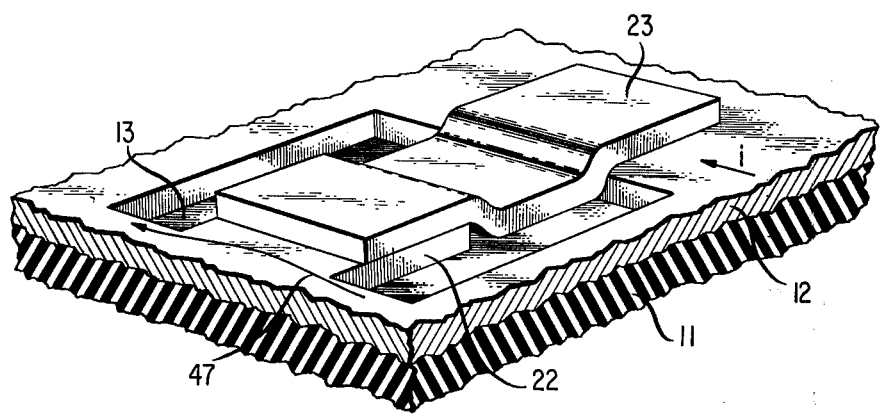
FIG. 2 shows a plan view of a portion of the memory of FIG. 1.

Apertures 13 can be seen to be of C-shaped geometries, illustratively, and can be thought of as square apertures with a tab 22 as shown more clearly in the enlarged view of FIG. 2. Layer 11 is shown exposed beneath the illustrative aperture. Importantly, a permalloy element 23 is formed in registry with each aperture so that its ends overlie conducting film 12 and its center is in proximity with and illustratively in contact with layer 11. Each permalloy element thus can be seen to be out-of-plane. That is, each element does not lie in a single plane parallel to the bubble layer. Typically, the apertures exclusive of the tab are square, having a measurement X on a side and being spaced apart a distance 2X. Each tab itself is square having a measurement X/2 on a side. Each permalloy element has a length 3X/2 and a width X/2.

Figure 3:
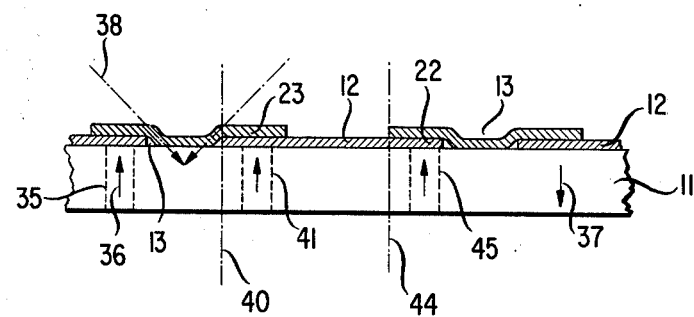
FIG. 3 shows a cross-sectional view of another portion of the memory of FIG. 1 taken along a path of bubble propagation therein.
Figure 4:
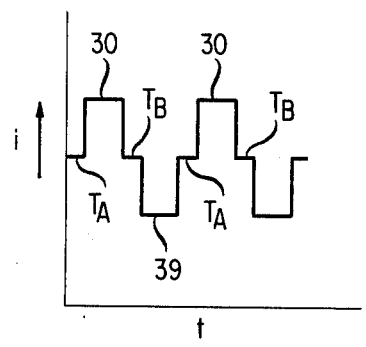
FIG. 4 shows a pulse diagram of the current drive pulses for achieving operation of the memory of FIG. 1.

A sequence of apertures and associated permalloy elements taken along path BP1 is shown in FIG. 3. A pulse train for moving bubbles along these positions is shown in FIG. 4. We will adopt the convention that positive current flow in film 12 is in a direction indicated by the arrow i in FIGS. 1 and 2 and corresponds to a positive pulse 30 in FIG. 4. The pulse train of FIG. 4 is applied by a suitable propagate pulse source represented by block 31 in FIG. 1. The train is applied to a broad area and low impedance conducting land 32 which is adapted to provide an overall uniform current flow transverse (illustratively perpendicular) to the paths of bubble propagation. A second land 33, at the top of FIG. 1, is shown connected to ground.

A bias field common to magnetic bubble memories is represented in FIG. 1 by block 34. The bias field is operative to determine a mean diameter for bubbles (35) in layer 11 as shown in FIG. 3. The bias further herein cooperates with the out-of-plane portions of the permalloy elements 13 to achieve low-energy rest positions for bubbles along the propagation paths. The bias field is applied in a direction normal to the plane of bubble movement and antiparallel to the magnetization of a bubble. If we adopt the convention that the magnetization of a bubble is directed upward as represented in FIG. 3 by arrow 36, then the bias field is directed downward as indicated by the arrow 37 in FIG. 3.

A permalloy element is operative to produce a relatively low bias field position at a point therealong at which the element is most remote from the surface of the underlying bubble layer. This is clear from FIG. 3 where arrow 38 is shown oriented at an angle to arrow 37 at a point where the permalloy element makes the transition from overlying film 12 to overlying layer 11. Magnetic poles are formed in this transition portion of the element which attract bubbles to the ends of the element which are most remote from layer 11 and repel bubbles from the intermediate portion of the element. In FIG. 3, bubble 35 is shown at a resulting low-energy position.

A negative current pulse 39 of FIG. 4, applied to film 12, results in a magnetic field operative to move a bubble past the intermediate portion of the permalloy element to the right edge of the associated aperture, a position demarcated by the vertical broken line 40 in FIG. 3. At time $T_A$ in FIG. 4 when pulse 39 terminates, bubble 35 moves under the right end of the associated permalloy element to the low-energy position there. Such a position is designated 41 in FIG. 3.

At a later time, source 31 applies a positive current pulse 30 of FIG. 4 to land 32. In response, a bubble moves to the right under the tab of the next consecutive aperture along the path of propagation. Such a position is designated 44 in FIG. 3. At a time $T_B$ when pulse 30 terminates, the bubble moves to the next low-energy position to the right, a position designated 45 in FIG. 3. One complete cycle of operation is now complete. Subsequent cycles are operative to move bubbles simultaneously in parallel channels from left to right as viewed in FIG. 1.

It is important to note that currents do not flow in the tabs. Rather, currents follow the paths of curved arrow 47 of FIG. 2 and are operative to move bubbles to the left edges of the permalloy elements. Also, it is to be noted, as represented by arrow 47, that the currents curve at the tabs to form localized fields which act to constrain bubbles as they move them. Thus, a pattern of apertures in a conductor film act to avoid bubble elongation from path to path, a failure mode destructive of information in prior art conductor-access arrangements.

It is also important that low impedance lands are employed as shown in FIG. 1. Such an arrangement is adapted to insure overall uniform current flow in film 12 and helps avoid high power requirements which have hitherto precluded use of current-access bubble devices. For example, the provision of currents from the left end of the memory of FIG. 1 to discrete conductors available for external electrical contact there as shown in U.S. Pat. Nos. 3,693,177 and 3,678,479 mentioned hereinbefore require high power, relatively thick conductor strips and are plagued by current nonuniformities. All these problems are avoided herein. Moreover, the use of a conductor film with apertures positioned to locally distort the uniform current flow pattern provides the necessary field drive gradients in a most efficient manner.

In one embodiment of this invention a magnetic garnet film of YSmCaGe, 1.8 microns thick was formed epitaxially on a layer of nonmagnetic garnet. A layer of 97Al-3Cu, 0.3 microns thick was deposited on the film and C-shaped apertures 4 microns by 4 microns with tabs 2 microns by 2 microns as shown in FIG. 1 were formed. Permalloy elements 3 microns by 6 microns by 0.2 microns thick were deposited also as shown in FIG. 1. Bubbles having a nominal diameter of 1.7 microns were moved in response to current pulses, as shown in FIG. 4, having magnitudes of 50 milliamperes/cell and durations of 0.5 microsecond with zero current levels of 0.5 microsecond duration. A bias field of 240 Oersteds was employed. Operation at a 500 kHz rate was achieved.

The duration of the zero-current levels between current pulses can be made vanishingly short depending on the mobility of the bubble material and the design distance a bubble must travel to reach a low-energy position at the termination of a drive pulse.

The various sources and circuits shown in FIG. 1 are operative under the control of a control circuit represented by block 50 in FIG. 1. The various sources and circuits herein may be any such elements capable of operating in accordance with this invention.

What is claimed is:

1. A magnetic bubble memory comprising a first layer of magnetic material in which magnetic bubbles can be moved, and means for moving magnetic bubbles in said layer, said means comprising a second layer of electrically conducting material coupled to said first layer and including a plurality of sets of apertures defining a plurality of bubble paths therein, said means also including a permalloy element overlying said second layer at each of said apertures, each of said elements having an out-of-plane geometry including at least a portion relatively close to said first layer at said apertures.

2. A magnetic bubble memory in accordance with claim 1 wherein said pattern of apertures are operative to shape currents applied to said second layer transverse to said bubble paths into a periodic pattern productive of localized fields which constrain magnetic bubbles in each position therein and means for generating currents in said second layer.

3. A magnetic bubble memory in accordance with claim 2 wherein said means for generating including low impedance lands having long dimensions parallel to said bubble paths and being disposed to encompass said paths therebetween, said lands being adapted to provide overall substantially uniform current flow therebetween when pulsed.

4. A magnetic bubble memory in accordance with claim 1 wherein said apertures are of C-shaped geometries.

5. A magnetic field memory in accordance with claim 1 wherein said portion is in contact with said first layer.

6. A magnetic bubble memory comprising a layer of magnetic material in which magnetic bubbles can be moved, and electrically conducting means for moving bubbles to first positions offset from associated rest positions along a path of bubble propagation in said layer, said memory also comprising out-of-plane magnetic elements coupled to said layer along said path for defining said rest positions.

7. A magnetic bubble memory in accordance with claim 6 wherein said magnetic elements comprise permalloy.

8. A magnetic bubble memory in accordance with claim 7 wherein said electrically-conducting means comprises a film of electrically-conducting material overlying said layer, said film including a plurality of sets of apertures for defining a plurality of paths for bubble movement in said layer.

9. A magnetic bubble memory (19) comprising a first layer (11) of magnetic material in which magnetic bubbles can be moved, CHARACTERIZED IN THAT the memory includes means (12, 13, 31, 32, and 33) for moving magnetic bubbles in the layer, the means comprising a second layer 12 of electrically conducting material having a plurality of sets of apertures (13) for defining a plurality of bubble paths (BP1, BP2...) in the first layer and a plurality of permalloy elements (23) overlying associate apertures, each of the elements having an out-of-plane geometry including at least a portion relatively close to the first layer.

* * * * *